(12) United States Patent
Dierre et al.

(10) Patent No.: US 9,052,402 B2
(45) Date of Patent: Jun. 9, 2015

(54) DETECTOR ELEMENT, RADIATION DETECTOR AND MEDICAL DEVICE CONTAINING THE DETECTOR ELEMENTS, AND METHOD FOR PRODUCING A DETECTOR ELEMENT

(75) Inventors: Fabrice Dierre, Möhrendorf (DE); Matthias Strassburg, Erlangen (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 171 days.

(21) Appl. No.: 13/590,622

(22) Filed: Aug. 21, 2012

(65) Prior Publication Data

US 2013/0049146 A1 Feb. 28, 2013

(30) Foreign Application Priority Data

Aug. 22, 2011 (DE) .................. 10 2011 081 322

(51) Int. Cl.
*G01T 1/24* (2006.01)
*H01L 31/0224* (2006.01)
*H01L 31/08* (2006.01)

(52) U.S. Cl.
CPC ............ *G01T 1/241* (2013.01); *H01L 31/0224* (2013.01); *H01L 31/085* (2013.01)

(58) Field of Classification Search
CPC .... G01T 1/241; H01L 31/0224; H01L 31/085
USPC ........................... 250/370.01, 370.12, 370.13
See application file for complete search history.

(56) References Cited

U.S. PATENT DOCUMENTS

| 4,273,594 | A | 6/1981 | Heller |
| 2007/0235824 | A1 | 10/2007 | Rakshit |
| 2010/0019334 | A1 | 1/2010 | Ivanov |
| 2010/0127182 | A1 | 5/2010 | Hackenschmied |
| 2012/0045868 | A1 | 2/2012 | Ayoub |

FOREIGN PATENT DOCUMENTS

| DE | 102009018877 A1 | 7/2010 |
| WO | WO 2010082955 A1 | 7/2010 |
| WO | WO 2010133869 A1 | 11/2010 |

OTHER PUBLICATIONS

German Office Action dated Feb. 14, 2012 for German Patent Application No. 10-2011-081322.5.
Chinese Office Action and English translation thereof dated Oct. 28, 2014.

*Primary Examiner* — Mark R Gaworecki
(74) *Attorney, Agent, or Firm* — Harness, Dickey & Pierce, P.L.C.

(57) ABSTRACT

A detector element is disclosed with a semi-conductive converter element and metal contacts arranged thereon for at least one anode and at least one cathode, wherein at least one of the metal contacts comprises a contact layer made from a contact material based on precious metal and ruthenium as its mixed component. Moreover, an embodiment of the invention concerns a radiation detector with the detector element with a ruthenium-containing contact layer and, optionally, with an evaluation unit to read out a detector signal, as well as a medical device with the radiation detector. Furthermore, a method for the production of a detector element is described which includes the installation step of a contact material of at least one of the metal contacts on the converter element, wherein the contact material includes a precious metal base with ruthenium as its mixed component.

20 Claims, 3 Drawing Sheets

DETECTOR ELEMENT, RADIATION DETECTOR AND MEDICAL DEVICE CONTAINING THE DETECTOR ELEMENTS, AND METHOD FOR PRODUCING A DETECTOR ELEMENT

PRIORITY STATEMENT

The present application hereby claims priority under 35 U.S.C. §119 to German patent application number DE 10 2011 081 322.5 filed Aug. 22, 2011, the entire contents of which are hereby incorporated herein by reference.

FIELD

At least one embodiment of the invention generally concerns a detector element with a semi-conductive converter element and metal contacts arranged thereon for radiation detectors, a radiation detector, a medical device and/or a method for producing such a detector element.

BACKGROUND

For the detection of ionizing radiation, in particular gamma radiation and X-radiation, scintillation detectors or direct-conversion radiation detectors based on semi-conductive materials are generally used. In scintillation detectors, the incident radiation is converted indirectly by electron excitation and conversion into photons of other wavelengths. These photons are then measured by photodetectors, whose output signal is a measurement of the incident radiation. Direct-conversion radiation detectors are different in that they are able to convert ionizing radiation directly into a readable signal. By way of a special semi-conductive material, the direct-conversion radiation detectors can also count the number of individual photons.

For this purpose, direct-conversion radiation detectors typically comprise detector elements which, in addition to the radiation detection material used for the detection of ionizing radiation, comprise at least two metal contacts made from a suitable contact material for at least one anode and one cathode. The radiation detection material and the contact material should therefore each have a specific charge carrier excitation energy level, and there should ideally be an ohmic contact on the boundary layer between both materials. This is because the radiation detection material is connected electro-conductively through the electrodes (i.e. the anode and the cathode) to the readout electronics and power supply of the detector via the metal contacts (e.g. platinum or gold contacts).

Previous direct-conversion radiation detectors have always been based on radiation detection materials made from semi-conductive compounds such as CdTe, CdZnTe, CdZnSe and CdZnTeSe. However, in these radiation detection materials, particularly when subjected to X-radiation and gamma radiation with high flux densities, as are typical and necessary in, for example, computed tomography devices, a space charge region is formed in the radiation detector via slow holes and/or fixed charges that are typically linked to deep and so-called intrinsic impurities. These deep impurities (with a depth of up to half the band gap energy) can trap the charge carriers produced by radiation and recombine with them. The space charge region produced in this way, and the reduction in movement ability for all charge carriers creates a reduction in the externally applied electric field, thereby reducing the pulse height, such that a clearly lower radiation intensity level is suggested. This means that the spectrum is shifted to lower energy values. This effect is called polarization, which limits the maximum detectable flux of a direct-conversion radiation detector.

In addition to the changes made to the internal electric field by this polarization effect, the contacts in conventional systems are not, however, usually ideal ohmic contacts, since they usually exhibit different carrier excitation energy levels at the boundary layer between the metal contact and the semi-conductive material. This is affected by various separation methods, such as hole-injection for platinum contacts and electron injection for indium contacts. This space charge region produced by the applied metal contacts also interferes with the separation and removal of the charge carriers produced by irradiation. The detector properties are also changed by the changing charge carrier transport properties. The space charge therefore intensifies the polarization effect.

To reduce polarization, the voltage applied externally to the detector can be increased. This does not, however, prevent the electric field change in the semiconductor. In order to minimize polarization, an attempt has also been made to produce an electrically conductive transition between metal and semi-conductive material, ideally an ohmic transition between metal and semi-conductive material, so that the charge carriers can pass through the boundary layer without a large amount of resistance.

For this, DE 10 2009 018 877 A1 describes, for example, an X-radiation detector, particularly for use in a computed tomography system, containing a semi-conductive material and a contact material, which each have their own specific charge carrier excitation energy. This X-radiation detector is characterized in that the excitation energy of conventional contact materials (e.g. Pt, Au, Ir or Pd) corresponds to the excitation energy of the semi-conductive material (e.g. CdTe, CdZnTe, CdTeSe and CdZnTeSe).

However, for certain applications, conventional contact materials are inadequate. This is particularly the case when the direct-conversion semi-conductive materials comprise a larger proportion of foreign ions and a reduced number of free charge carriers, for example to match the radiation converter to an application-relevant energy field.

SUMMARY

At least one embodiment of the present invention is directed to an improved detector elements with semi-conductive, preferably direct-conversion, converter elements with metal contacts arranged thereon for the detection of ionizing radiation, which in particular comprise an electrically conductive transition between the metal and the contact layer. At least one embodiment of the invention is further directed to radiation detectors and medical devices with the detector elements and/or a method for producing the detector elements.

The detector element according to at least one embodiment of the invention comprises a semi-conductive converter element with metal contacts arranged thereon for at least one anode and one cathode. The semi-conductive converter element comprises a radiation detection material, in which the incident photons absorbed by the material can be directly or indirectly measured. In a direct-conversion material, the incident radiation from the production of charge carriers in the radiation detection material can be detected directly via a counting rate measurement. The charge carrier pairs produced by X-ray photons (electron-hole pairs) are accelerated by applying an external electric field to the respective electrode (electrons to the anode, holes to the cathode) and, on arrival, induce a pulse on the respective electrode, which are then detected as a current pulse or a voltage pulse by an electronic amplifier.

BRIEF DESCRIPTION OF THE DRAWINGS

The invention is illustrated in greater detail by means of the exemplary embodiments with reference to the attached drawings. The drawings are only intended to demonstrate the invention, but the invention should not be restricted to them. The following are shown.

Figure 1:
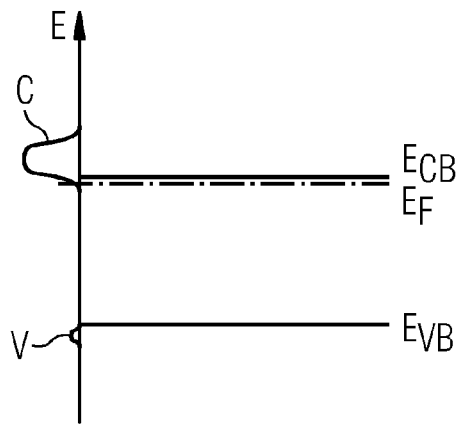
FIG. 1 a schematic representation of the electronic ratios in a type-n+ semiconductor, FIG. 2 a schematic representation of the electronic ratios in a type-p+ semiconductor, FIG. 3 a schematic representation of the electronic ratios in a type-p semiconductor, FIG. 4 a schematic representation of the electronic band structure ratios in a contact between a p-CdTe semiconductor and a Pd contact layer of a metal contact in a detector element according to the prior art, produced by directly contacting (sputtering) the metal and the semiconductor, FIG. 5 a schematic representation of the electronic band structure ratios in a contact between a p-CdTe semiconductor and an electrolessly deposited Pd contact layer of a metal contact in an inventive detector element with a quasi-ohmic contact, FIG. 6 a schematic representation of the electronic band structure ratios in a quasi-ohmic contact between a CdTe semiconductor and an Ru contact layer of a metal contact in a detector element according to the invention, FIG. 7 a schematic representation of the work functions of various precious metals and a CdTe semiconductor (according to Michaelson), FIG. 8 an embodiment of a radiation detector according to the invention and FIG. 9 an embodiment of a medical device according to the invention.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Before discussing example embodiments in more detail, it is noted that some example embodiments are described as processes or methods depicted as flowcharts. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Methods discussed below, some of which are illustrated by the flow charts, may be implemented by hardware, software, firmware, middleware, microcode, hardware description languages, or any combination thereof. When implemented in software, firmware, middleware or microcode, the program code or code segments to perform the necessary tasks will be stored in a machine or computer readable medium such as a storage medium or non-transitory computer readable medium. A processor(s) will perform the necessary tasks.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Portions of the example embodiments and corresponding detailed description may be presented in terms of software, or algorithms and symbolic representations of operation on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

In the following description, illustrative embodiments may be described with reference to acts and symbolic representations of operations (e.g., in the form of flowcharts) that may be implemented as program modules or functional processes include routines, programs, objects, components, data structures, etc., that perform particular tasks or implement particular abstract data types and may be implemented using existing hardware at existing network elements. Such existing hardware may include one or more Central Processing Units (CPUs), digital signal processors (DSPs), application-specific-integrated-circuits, field programmable gate arrays (FPGAs) computers or the like.

Note also that the software implemented aspects of the example embodiments may be typically encoded on some form of program storage medium or implemented over some type of transmission medium. The program storage medium (e.g., non-transitory storage medium) may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The example embodiments not limited by these aspects of any given implementation.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" of "displaying" or the like, refer to the action and processes of a computer system, or similar electronic computing device/hardware, that manipulates and transforms data represented as physical, electronic quantities within the computer system's registers and memories into other data similarly represented as physical quantities within the computer system memories or registers or other such information storage, transmission or display devices.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The detector element according to at least one embodiment of the invention comprises a semi-conductive converter element with metal contacts arranged thereon for at least one anode and one cathode. The semi-conductive converter element comprises a radiation detection material, in which the incident photons absorbed by the material can be directly or indirectly measured. In a direct-conversion material, the incident radiation from the production of charge carriers in the radiation detection material can be detected directly via a counting rate measurement. The charge carrier pairs produced by X-ray photons (electron-hole pairs) are accelerated by applying an external electric field to the respective electrode (electrons to the anode, holes to the cathode) and, on arrival, induce a pulse on the respective electrode, which are then detected as a current pulse or a voltage pulse by an electronic amplifier.

In addition, the detector element according to at least one embodiment of the present invention comprises metal contacts arranged on the converter element for at least one anode and one cathode. In at least one embodiment, at least one of the metal contacts comprises a contact layer made from a precious-metal-based contact material and ruthenium as a mixed component. In this context, "precious-metal-based" is understood to mean that the base component of the contact material alongside the ruthenium component comprises one or a mixture of a plurality of precious metals, in particular the metals in subgroups 8 to 11 of the periodic table. The contacts can also comprise additional mixed components and alloys of other precious metals, semi-precious metals or even non-metals, provided that they do not have a significant effect on the electrical contact between the converter element and the contact material. In this regard, the precious-metal-base and the ruthenium components can exist in any proportion, wherein the term "precious-metal-based" does not mean that the precious metal component is necessarily proportionately greater than the ruthenium component.

Under the above definition of the detector element, it can also be the case that a ruthenium-containing metal contact on the converter element is embodied on the anode side only or on the cathode side only, wherein the metal contact is preferably embodied on both the anode side and the cathode side. The advantage of the ruthenium-containing metal contact is that the energy level of the metal contact which is in contact with the radiation detector can be altered by the proportion of ruthenium. The work function of the charge carrier in the ruthenium-containing metal contact is adjusted by the proportion of ruthenium in such a way that an improved electrically conductive transition, ideally an ohmic transition, between the metal and semi-conductive material is produced.

Figure 4:
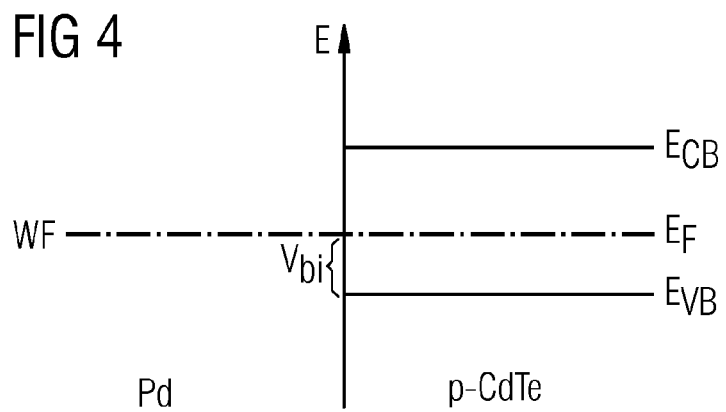

An ohmic contact is one where the contact resistance between the metal and semiconductor is negligible compared to the resistance of the semi-conductive material. For this, it is not dependent solely on the Fermi levels of both the materials which are to be connected, but also on the microprocesses occurring during the production of contacts in the barrier layers adjacent to the transition. For example, a drawing is depicted in FIG. 4 of the band structure of the actual material process between palladium (Pd) on semi-insulating p-CdTe after direct contact, e.g. deposition by means of cathode sputtering or evaporation. Although the Fermi levels of both materials are at the same height, e.g. on the assumption that the charge carrier work function in palladium is 5.2 eV and that the Fermi level of CdTe is 0.7 eV below the valence band gap in a vacuum (EVB=5.9 eV)), this contact is not an ohmic contact, for it possesses a high barrier for the charge carrier transition from the semiconductor into the metal contact—the so-called "built-in voltage Vbi".

In an ohmic contact, the electrons can flow from the almost infinite metal pool into the semiconductor and back, so that the transfer of charge carriers produced in the radiation detection material, e.g. electrons, are not obstructed on their way to the electrodes. Since an ohmic contact only represents the ideal case that is very difficult to obtain in practice, reference will henceforth be to quasi-ohmic contacts, if the transition is designed to be essentially barrier-free.

Since the precious metals commonly used in metal contacts, such as gold (Au), platinum (Pt), palladium (Pd) and iridium (Ir) have high work functions at room temperature (at approx. 25° C. according to Michaelson) of approximately 5.2 eV or higher, they are only suitable for very few semiconductive material systems. However, the requirements for the converter element have been recently altered in such a way that the Fermi level of relevant semi-conductive converters, such as those in CdZnTe semiconductor systems or the like, is less than the work function of these metals and that the built-in voltage is too high in comparison to the conventional gold, platinum or palladium contacts, due to charged defects, in particular cadmium defects, in the middle band gap range. Therefore, there cannot be any adequate alignment of the energy bands of the metal and semiconductor material with the conventional metal contacts, such as platinum or gold contacts.

In the course of intensive research, the inventors discovered that the work function of the precious metals used for metal contacts could be lowered when mixed with ruthenium that has a work function of approximately 4.7 eV. It is preferred that the work function of ruthenium-containing metal contacts is lower than 5.6 eV, preferably also in the range 5.0 to 5.5 eV and more preferably in the range 5.0 to 5.4 eV. By varying the ruthenium proportion in the metal contact, the work function of the metal contact can be aligned with the local boundary-lying Fermi level of the intermediate layer of different semiconductor compounds in such a way that there is a low built-in voltage (preferably lower than the thermal activation point of the charge carriers), so that this can be overcome by the charge carriers. Thus contacts with quasi-ohmic characteristics can be procured between the radiation detection material and the metal contact material in the detector elements according to the present invention on the anode and/or cathode side. In particular, an adjustment, particularly a lowering of the work function of the metal contact to the respective semiconductor elemental energy band required for the transition, is possible to almost any extent with ruthenium alloys and a corresponding adjustment of the ruthenium proportion.

These and further advantages of the detector element according to at least one embodiment of the invention make it suitable for use in radiation detectors and in particular in detectors for the counting rate measurement of X-radiation and/or gamma radiation. The invention is therefore also directed at a radiation detector with a number of detector elements according to at least one embodiment of the invention. The radiation detector can also optionally possess an evaluation unit for reading out a detector signal which can be designed for example as a component of the radiation detector. Alternatively, the evaluation unit can also be designed as a separate system that can be connected with the radiation detector.

Due to the advantages illustrated above, and particularly due to the improvement of space-charge and polarization effects, even under standard operating conditions, the radiation detectors according to an embodiment of the invention are suitable for application in medical devices, in particular in devices with a counting rate measurement of X-radiation and/or gamma radiation, especially at higher radiation intensity levels. An embodiment of the invention is therefore also directed at a medical device with a radiation detector according to at least one embodiment of the invention. Particular examples of this are X-ray systems, gamma-ray systems, CT scanners and radionuclide emission tomography machines, such as PET scanners or SPECT scanners.

The detector element can be inventively produced, in at least one embodiment, by a method comprising at least the step of applying at least one of the metal contacts from at least one contact material comprising a precious metal base and ruthenium as a mixed component.

The dependent claims and the following description contain particularly advantageous developments and further developments of at least one embodiment of the invention, wherein it is explicitly indicated that the radiation detector according to the invention, the medical device according to at least one embodiment of the invention and the method according to at least one embodiment of the invention can be further developed in accordance with the dependent claims to the detector element, and vice versa.

In a first embodiment, the detector element according to the invention comprises a semi-conductive converter element with a radiation detection material, which is made from semiconductor compounds and in particular semiconductor compounds with direct-conversion characteristics. Examples of direct-conversion semiconductor compounds, which can be employed in the detector element according to at least one embodiment of the invention, are II-VI or III-V semiconductor compounds, in particular selenides, tellurides, antimonides, nitrides, arsenides and phosphides, such as, for example, material systems based on CdSe, CdZnTe, CdTeSe, CdZnTeSe, CdMnTeSe, GaSb, GaInSb, GaInAsSb, GaInPSb, AlInSb, AlInAsSb, GaN, GaInN, GaAsN, GaInAsN and InP. It is preferred that the semiconductor compounds be selected from the following group:

$Cd_xZn_{1-x}Te_ySe_{1-y}$ (with $0 \leq x \leq 1$; $0 \leq y \leq 1$), $Cd_xMn_{1-x}Te_ySe_{1-y}$ (with $0 \leq x \leq 1$; $0 \leq y \leq 1$), $Ga_xIn_{1-x}As_ySb_{1-y}$ (with $0 \leq x \leq 1$; $0 \leq y \leq 1$), $Al_xIn_{1-x}As_ySb_{1-y}$ (with $0 \leq x \leq 1$; $0 \leq y \leq 1$), $Ga_xIn_{1-x}P_ySb_{1-y}$ (with $0 \leq x \leq 1$; $0 \leq y \leq 1$), $Al_xIn_{1-x}P_ySb_{1-y}$ (with $0 \leq x \leq 1$; $0 \leq y \leq 1$), $Ga_xIn_{1-x}Sb_yN_{1-y}$ (with $0 \leq x \leq 1$; $0 \leq y \leq 1$), and $Ga_xIn_{1-x}N_yP_{1-y}$ (with $0 \leq x \leq 1$; $0 \leq y \leq 1$).

A particular example semiconductor material is either CdTe or CdZnTe, due to their energy band positions, wherein the band gaps between the valence band and the conduction band increase to higher values with an increasing Zn proportion from 1.5 eV (4.45 eV to 5.95 eV below the vacuum level of CdTe). Thus Cd0.9Zn0.1Te has, for example, a band gap of 1.65 eV (4.3 eV to 5.95 eV below the vacuum level). According to the number of free charge carriers, which are reduced during p-type doping, the Fermi level lies within this band gap range, wherein the p-type conduction switches to the n-type conduction at a point somewhat above the middle of the band gap. If there are very few free charge carriers, the Fermi level will lie approximately in the middle, i.e. approximately 5.1 to 5.4 eV for p-type doped Cd0.9Zn0.1Te and approximately 5.2 to 5.4 eV for p-type doped CdTe.

Other semiconductor compounds act in the same way as the example CdTe system illustrated above, so that, with this knowledge the invention can also be transferred to these. Moreover, the semiconductor compounds embodied above can additionally be doped with further doping substances. The person skilled in the art is also familiar with these doping substances, such as for example halides and group III elements for II-VI compounds, chalcogens (group VI elements), group IIa and IIb elements, group IV elements for III-V compounds etc.

The detector element of at least one embodiment inventively comprises a radiation detection material with a Fermi level from approximately 5.0 to approximately 5.6 eV, preferably from approximately 5.1 to approximately 5.4 eV and particularly preferably from approximately 5.2 to approximately 5.4 eV. For these systems, the work function of pure platinum or palladium contacts is approximately 5.6 to 5.8 eV (for platinum) and approximately 5.4 to 5.6 eV (for palladium) (at a room temperature of approximately 25° C. according to Michaelson). As the gap between the valence band and the vacuum level is 5.95 eV in the bulk of the semiconductors (CdTe and CdZnTe), there is a high built-in voltage during direct contact, which prevents the formation of an ohmic contact. This usually causes space charge effects, particularly from positive holes caused by cadmium defects near the contact surface, and therefore lead to polarization at the boundary layer between the semiconductor and the metal contact.

The work function can be lowered to the desired value by the described ruthenium-containing metal contacts, as a function of the ruthenium content, so that the detector elements according to at least one embodiment of the invention form improved electrical contacts between the semiconductor elements and the metal contact embodied above. By varying the ruthenium content, the work function can be adjusted relatively well to the required level, since ruthenium exhibits a work function of only approximately 4.7 eV (according to Michaelson at RT), as stated above.

In an additional embodiment of the detector element according to at least one embodiment of the present invention, the radiation detection material comprises a number of defects in a region of the converter element adjacent to the contact layer, which reduce the contact resistance between the metal and the semiconductor, compared to direct contact between both substances. These defects can, for example, be obtained by exchanging cadmium atoms in the region next to the boundary layer with metal atoms e.g. ruthenium atoms, or with other doping substances. These additional defects can preferably be produced in these regions during production of the contacts. For example, the inventors discovered during their research that these exchange reactions take place during the electroless deposition of ruthenium-containing metal contacts on the semiconductor elements. Depending on the ruthenium compound used, other foreign atoms can be built into the semiconductor grid on the boundary layer. In this method, the concentration of foreign atoms and defects must be at its highest between the metal contact and the semiconductor material, and decreases gradually with increasing depth of penetration into the semiconductor element.

During the electroless deposition of metals, such as Pt, Au, Ru, Pd, an intermediate layer is formed between the actual electrode material and the semiconductor. This intermediate layer is characterized in that the built-in transition voltage is reduced. Thus it is possible to obtain quasi-ohmic transitions between materials which otherwise display blocking contact characteristics due to the high barrier for the charge carriers and the built-in voltage. This intermediate layer is characterized by surface conditions, so that it is still only possible to talk in localized terms about a Fermi level in this intermediate layer. By varying the ruthenium content in the metal contact, the work function of the metal contact can be aligned with the local Fermi level of the intermediate layer of different semiconductor compounds in such a way that the built-in voltage is low and preferably lower than the thermal activation point of the charge carriers, so that this can be overcome by the charge carriers. Thus contacts with quasi-ohmic characteristics can be procured between the radiation detection material and the metal contact material in the detector elements according to the invention on the anode or cathode side. In particular, an adjustment, particularly a lowering of the work function of the metal contact to the respective semiconductor elemental energy band required for the transition, is possible to almost any extent with ruthenium alloys and a corresponding adjustment of the ruthenium content.

The advantage over direct deposition, in which a relatively large built-in voltage usually remains (fundamentally the difference between the semiconductor's valence band upper edge and the work function of the metal), lies in the good variability of the bands above the [produced] intermediate layers. The bands can be modified locally for this via the intermediate layers or the surface conditions in such a way that there are options for the charge carriers to enter the bands. This is achieved, for example, because local barriers are small or because tunnelling is also made possible.

An additional advantage of forming such an intermediate layer with defects in the region of the converter element next to the boundary layer lies in compensating the cadmium defects and reducing the polarization effects on the boundary layer. Thus the built-in voltage Vbi is also reduced, since the energy bands responsible for the conductivity of the transition towards the Fermi level of the metal contacts are "warped", thereby raising the conductivity. "Warping" is understood to be the formation of a plurality of interim levels due to defects in the semiconductor layer, which gradually alter the energy bands with the depth of penetration into the converter element. Depending on the number of defects, the energy level and/or energy band responsible for the transition of charge carriers can be aligned to the Fermi level of the metal contact in such a way that the built-in voltage Vbi is minimized. In the ideal case, the built-in voltage can become so negligibly small that a quasi-ohmic contact is formed.

Preferred examples for defects present in a converter element region adjacent to the contact layer are halogen-based, oxygen-based or metal-based defects. These are formed, for example, by an electroless deposition of metal contacts made from halogen-containing or oxygen-containing ruthenium compounds or palladium compounds, e.g. from an aqueous solution.

In an example embodiment, the contact material can comprise a precious metal alloy. Preferred alloys are Pd/Pt, Pd/Ru, Pt/Ru and Pd/Pt/Ru. However, even gold or other precious metals can be used for the contact material. If an alloy is used which does not otherwise comprise ruthenium as an alloy component, the ruthenium component can also exist in another form, e.g. as a mixing component, in a metal contact constructed according to at least one embodiment of the invention.

In a particular example embodiment, the contact material comprises palladium, platinum or a mixture thereof, since these are already relatively close to the respective Fermi levels of the conductor materials used and to the intermediate layers produced thereon during the electroless deposition process; these, however, have too high a work function for the most part, meaning the built-in voltage and the space charge region are for the most part too high for a good electrical transition.

Depending on the combination of the semi-conductive converter element and the precious metal base of the contact material, the concentration range for ruthenium additives is very wide-ranging. Therefore, it is possible that, at a relatively high Fermi level, it is sufficient to add a relatively small amount of ruthenium to the precious metal base, in order to align its work function significantly to the respective Fermi level of the semiconductor material.

For example, the ruthenium content of the contact material can be approximately $1 \times 10^{15}$ atoms/cm3 to approximately $1 \times 10^{20}$ atoms/cm3 when there is a semiconductor system with relatively high p-type conductivity, since the Fermi level of the semiconductor is close to the valence band edge. This is particularly applicable for the II-VI semiconductors: high p-type conductive CdTe, CdZnTe, CdSeTe, and CdMnTe.

If the energetic position of the Fermi level increases, it can be advantageous for the ruthenium content in the contact material to be in a range of approximately 0.1% to 10%. This is appropriate, for example, in semiconductor systems with a high proportion of foreign ions.

In semi-insulating systems, e.g. based on foreign doping or doping by unit defects, where the Fermi level is fixed in the middle of the band gap (e.g. in CdTe, CdZnTe, CdMnTe, CdTeSe and CdMnTeSe systems), a ruthenium content between approximately 10% and 50% is appropriate in the contact material, as the band distortion in the surrounding area and in the intermediate layer is so strong that the high built-in voltage is reduced considerably.

Additionally, the amount of the built-in voltage reduction can be adjusted by way of the size and composition of the intermediate layer.

An additional example embodiment of the detector element according to the invention can comprise a contact layer on at least one of the metal contacts, which comprises two or more layers. Any number of layers can be chosen, provided that there are no losses, or only very slight losses, in conduction because of this. In order to create an ideal, largely ohmic contact on the boundary layer to the semiconductor material, it is advisable that at least the contact material of the layer which is in contact with the semi-conductive converter element comprises ruthenium. The additional layers can contain no ruthenium or even contain ruthenium additives. A preferred additional layer has a proportion of gold, in order to improve contact between an often gold-coated conductor and the anode and/or cathode.

An example embodiment of the radiation detector according to the invention comprises one of the preferred detector elements illustrated in detail above with a ruthenium-containing metal contact and, optionally, an evaluation unit for reading out a detector signal.

Radiation detectors according to at least one embodiment of the invention can be designed either as Schottky detectors or as ohmic detectors. In a Schottky detector, there is a transition from the semiconductor to the metal (electrode) in only one direction, i.e. this detector blocks in one direction. In an ohmic detector, the electrons can flow in both directions, i.e. from the semiconductor to the metal and vice versa. An ohmic detector consequently does not have this blocking effect like a Schottky detector.

A radiation detector of this type can be formed as a singular element or as a combined element from two or more individual detectors. In several detectors, it is common to talk about a detector array, which is often constructed from an individual semiconductor base element, which has been equipped with septa as insulating blocking elements and electrodes. In this detector array, the incidence of irradiation preferably occurs on the cathode side, which has been deposited and/or evaporated on the semiconductor base element. In a singular detector element, the direction of radiation is fundamentally independent from the formation of the electrodes and can take place laterally or even on the anode or cathode side.

In the application of an example embodiment of the radiation detector as illustrated in detail above in a medical device, measurement of high radiation flows, as can be found in particular in computed tomography, is possible due to the prevention and/or reduction of polarization at the boundary layers between the converter element and the metal contact(s). Thus a good energy resolution at high radiation flows can be obtained without a high technical equipment cost, even at ambient temperature. An additional advantage of the application of detector elements with ruthenium-containing metal contacts according to at least one embodiment of the invention is that shorter pulse durations than in conventional devices are made possible by, among other things, the prevention of charge carrier dispersion clouding due to space charge regions.

The ruthenium-containing metal contacts employed in the detector element according to at least one embodiment of the invention can, as stated above, generally be produced by a method comprising the deposition step of a ruthenium-containing contact material of at least one of the metal contacts on the converter element. By varying the ruthenium content in the deposited metal contact, the work function of the metal contact can be better adjusted to the built-in voltage and the Fermi level of various semiconductor compounds. Thus contacts with an improved electrical transition, a quasi-ohmic behavior between the radiation detection material and the metal contact material, can be obtained in the detector elements according to the invention on the anode and/or cathode side, as has already been illustrated above.

In a preferred embodiment and in a variant of the deposition process, the precious-metal-based contact material with ruthenium and/or palladium as its mixed component is deposited electrolessly from a solution of one precious metal compound and one ruthenium and/or palladium compound, either together or separately from one another. The precious metal compound can thereby comprise any number of precious metal compounds from one or more metals or metal cations. In the same way, the ruthenium compound and/or the palladium compound can comprise one or more different compounds. In particular, ionic and/or covalent precious metal compounds, ruthenium compounds or palladium compounds can be used for the deposition, as long as they can be deposited electrolessly as a contact layer on the semiconductor surface.

Figure 5:
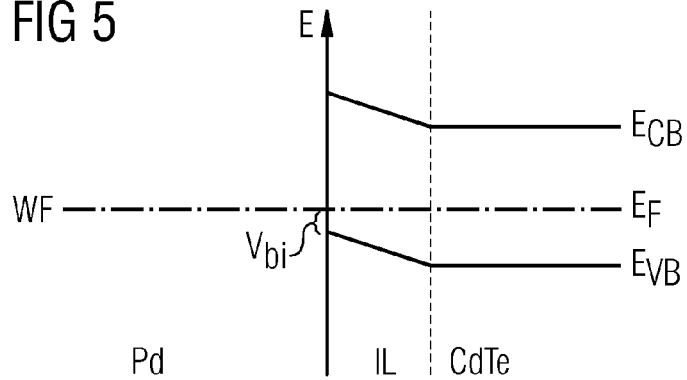

The same principle of energy band distortion in the semiconductor element on the Fermi level of the metal contact can be observed not only in ruthenium compounds, but also in palladium compounds, if they are deposited electrolessly on the semiconductor element. Corresponding defects, e.g. from palladium atoms or halogen and/or oxygen atoms, are formed near the boundary layer. For palladium, the state of valence band distortion on the Fermi level of the metal contact is depicted in FIG. 5. The reduction in built-in voltage in the electroless deposition of palladium onto the CdTe semiconductor element and in the formation of palladium defects near the boundary layer can be seen here, compared to the energy state in the direct contact method (FIG. 4). The invention therefore also concerns detector elements with palladium-containing metal contacts, in which defects are formed via the electroless deposition of palladium contacts onto the converter element in a region near the boundary layer.

Polarization can be reduced or minimized by this electroless deposition method. Via the exchange of converter element atoms of the contact layer, e.g. Cd atoms, by metal atoms, in particular ruthenium and/or palladium atoms, the number of charged vacancies (e.g. here Cd vacancies, such as $Cd2+$) functioning as acceptors is reduced. Should there already be Cd vacancies in the radiation detection material on the boundary layer of the metal contact, light metal atoms or atoms from the compounds used in deposition are inserted into the area adjacent to the contact layer during deposition. These are particularly halogen, oxygen or metal atoms, according to the starting compound used. These then form halogen-, oxygen- or metal-based defects in the region adjacent to the contact layer, in particular within the band gap of the semiconductor element. The $Cd2+$ vacancy thereby lies almost in the centre of the band gap, wherein this can be reduced energetically by vacancy filling or by local neutralization by donors, so that they are closer to the upper edge of the valence band. An improved electrically conductive transition, preferably a quasi-ohmic contact, can be produced between the metal and the semiconductor via these defects inserted directly into the crystal. An additional advantage of these electrolessly produced contacts is that these contacts possess a low leakage current and therefore produce little contact noise.

An exchange of semiconductor atoms and metal atoms and/or halogen and/or oxygen atoms takes place on the boundary layer during the electroless deposition method, as has already been discussed above. Thus an improved, mechanically stronger transition can also be produced in addition to the formation of a quasi-ohmic contact, such that the life span of the detector element is improved.

In another example embodiment of this electroless deposition method, the metal with the highest electrochemical potential, preferably ruthenium, is deposited first; before the metal with the next-highest electrochemical potential, e.g. palladium or platinum, is deposited (i.e. the most chemically precious material is deposited last). Even during the metallization of the semiconductor material, there is a partial exchange of the initially deposited ruthenium atoms with platinum atoms. This happens during the deposition of platinum onto ruthenium that has already been deposited, for example. This exchange can be affected by the process control in such a way that the composition of the contact layer of the metal contact in each mixture ratio can be adjusted. Parameters which can affect the composition of the contact layer during the deposition of the second metal with a lower electrochemical potential than the first metal are, for example, the temperature or pH of the metal-containing solution, the concentration of the solution and/or the duration of the deposition process. For this metal atom exchange to be possible in a desired form, the layer thickness of the deposited metal layers cannot be so thick that atom exchange only takes place in one region on the surface of the corresponding layer, without affecting the layer below. The contact layer thickness of the metal contact is therefore preferably in the region of very few atom layers, e.g. fewer than 100, preferably fewer than 50 or ideally fewer than 10 atom layers.

In particular, the metal's work function can be adjusted simply via the adjustable mixture ratio of the contact layer's metal material during this electroless deposition method, in such a way that it corresponds to the built-in voltage and the Fermi level of the semiconductor. This means that a metal contact can be deposited onto different dosed and/or semiconductor compounds by altering the composition of the metallization of this contact layer; this is a quasi-ohmic contact. The variability of this method is therefore advantageous.

It is preferable to use commercially available solutions in the electroless deposition method. In one embodiment, these solutions comprise metal salts as their precious metal compounds, preferably halides, cyanides and chlorometallic acids of precious metals. These solutions comprise, for example, ruthenium salts as their ruthenium compounds, preferably halides, cyanides and chlorometallic acids, which are each separated from the applied precious metals according to their electrochemical potential or, optionally, can be deposited together with them.

Preferred examples of platinum compounds are $H2PtCl6$, $PtI2$ or $PtBr2$. Exemplary palladium compounds are, among others, $PdCl2$, $PdBr2$ or $PdI2$. These salts exist in solution mainly as complex compounds with additional donors, such as water, tetrahydrofuran or additional complexing and/or chelating agents.

Preferred examples of ruthenium compounds are $RuCl3$, $RuBr3$, $RuI3$ or their complex compounds with, for example, water, tetrahydrofuran or additional complexing and/or chelating agents.

In an example embodiment of the method, the solutions of the precious metal compounds and/or of the ruthenium compounds comprise water and/or organic solvent. Preferred examples of organic solvents are solvents with a lower boiling point—in the region of no more than 180° C. and preferably no more than 125° C., such as ethylene glycol, acetone etc.

Such an electroless deposition method enables a metallization of the semiconductor materials at a high conversion rate, since it is a purely chemical method within the solution with relatively short deposition process durations. Deposition from solution has the additional advantage that cleanroom conditions are not generally required.

Another advantage of the electroless deposition method is that it is relatively simple to detect the metallization structure, in particular the composition of the contact layer. Therefore, a depth profile analysis of the composition can be carried out, for example, using a spectroscopic method, such as Secondary Ion Mass Spectrometry (SIMS), Energy-Dispersive X-ray Spectroscopy (EDX), Rutherford Backscattering Spectrometry (RBS), Inductively Coupled Plasma Mass Spectrometry (ICPMS), by chemical analyses or by a microsection analysis.

Figure 2:
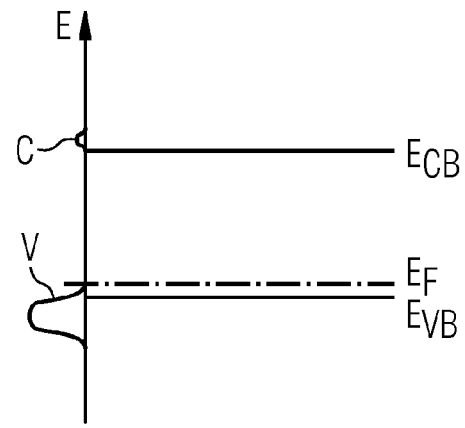
Figure 3:
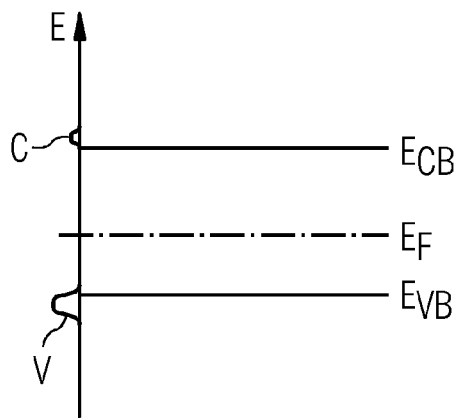

FIGS. 1, 2 and 3 depict schematic representations of the electronic ratios in an n+ semiconductor (FIG. 1), a p+ semiconductor (FIG. 2) and a p semiconductor (FIG. 3). In each figure, the Fermi level (EF) of a semiconductor element, e.g. CdTe, lies between the valence band energy (EVB) and that of the conduction band (ECB). The corresponding distribution of the free charge carriers in the energy bands can be seen on the energy axis (E).

In FIG. 1, a type-n-conductive semiconductor with a high concentration of free charge carriers (distribution C) in the conduction band (ECB) is shown (type n+ semiconductor). The concentration of the free charge carriers (distribution V) in the valence band is thereby clearly lower. Here, the Fermi level (EF) is close to the conduction band (ECB)

In FIG. 2, a type-p-conductive semiconductor with a high concentration of free carriers (distribution V) in the valence band (EVB) is shown (type p+ semiconductor). The concentration of free charge carriers (distribution C) in the conduction band (ECB) is, in contrast, clearly smaller. Therefore, the Fermi level (EF) is close to the valence band (EVB).

In FIG. 3, a p-type semiconductor with a Fermi level within a relevant range for its use according to an embodiment of invention is depicted. The semiconductor depicted here has a reduced number of free charge carriers, so that this semiconductor comprises an improved intrinsic behavior. In particular, the distribution V is clearly smaller than in the semiconductor in FIG. 2. Due to this intrinsic method the semiconductor is particularly suitable for a radiation detector, since it is mainly the radiation induced charge carriers that are measured. The Fermi level (EF) lies relatively centrally between the conduction band (ECB) and the valence band (EVB).

In FIG. 4, a schematic representation of the electronic band structure ratios in a contact between a p-CdTe semiconductor and a Pd contact layer of a metal contact in a conventional detector element according to the prior art is depicted, which was produced via direct contact (sputtering) between the metal and the semiconductor. Comparable band structures would be obtained via gas phase deposition. Even if the Fermi level of the metal (corresponding to the work function (WF) of the electrons) is the same as the Fermi level of p-CdTe (e.g. 5.2 eV here), as is depicted in this band structure, the built-in voltage (Vbi) for the charge carriers is relatively large. The voltage Vbi is thereby the limit which the charge carriers must overcome during the transition of the semiconductor element into the metal contact, or vice versa. Then, in the preferred semiconductor elements, which partly lie in the middle of the band gap for the defects responsible for charge carrier transfer, the built-in voltage is partly so high that there is no ohmic contact, as the Fermi levels of the convert element and of the metal contact are in an insulating state at the same level. In particular, a blockage at room temperature is fundamentally to be expected for barriers larger than 100 meV.

In FIG. 5, a schematic representation of the electronic band structure ratios in a contact between a p-CdTe semiconductor and an electrolessly deposited Pd contact layer of a metal contact in a detector element with a quasi-ohmic contact is shown. Here, the built-in voltage is warped by the above construction of metal, halogen or oxygen atoms into the semiconductor element in the range of the intermediate layer (IL) to the Fermi level of the metal contact, here made of Pd. In this intermediate layer, there is no uniform Fermi level rather the number of defects and the surface conditions in each respective layer area provides the degree of distortion and also the locally existing Fermi level. Thus the built-in voltage is sharply lowered, so that a reduction in leakage current enables a quasi-ohmic method for the electrolessly deposited contact, compared to the direct contact method. A lower leakage current also produces a lower noise. In principal, the concept of defect production in an intermediate layer of the converter element at the boundary layer between the semiconductor layer and the metal layer by electroless deposition of the metal contact on the semiconductor element, as depicted here, is not restricted to ruthenium-containing contacts, but can also be applied to, for example, palladium contacts.

Figure 6:
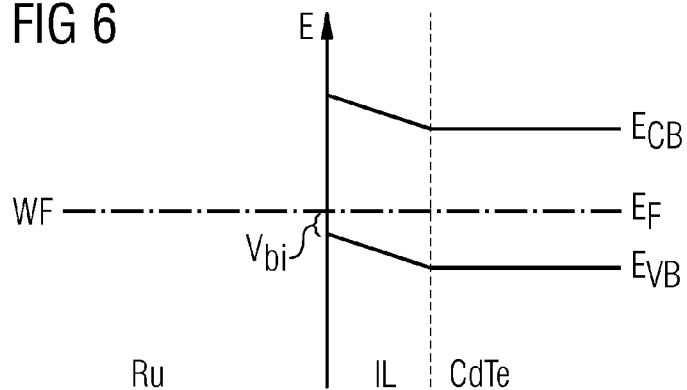

FIG. 6 depicts the ratios in the same way for the electroless deposition of ruthenium on p-CdTe. FIG. 6 is a schematic representation of the electronic band structure ratios in a contact between a p-CdTe semiconductor and an Ru contact layer of a metal contact in a detector element according to the invention. Here, the Ru contact layer was also deposited electrolessly from a diluted ruthenium chloride solution. Thus the converter element comprises CdTe semiconductor grid defects in the intermediate layer (IL), which are charged with ruthenium, halogen and oxygen atoms. The band structure is warped by these defects for the Fermi level of the ruthenium-containing metal contact, so that a value is produced for the built-in voltage (Vbi), which is preferably no larger than 100 meV, and even more preferably no larger than 25 meV.

The built-in voltage can be largely minimized by varying the concentration of defects and/or by further varying the Fermi level of the metal contact, e.g. by reducing the ruthenium content in the metal contact.

Figure 7:
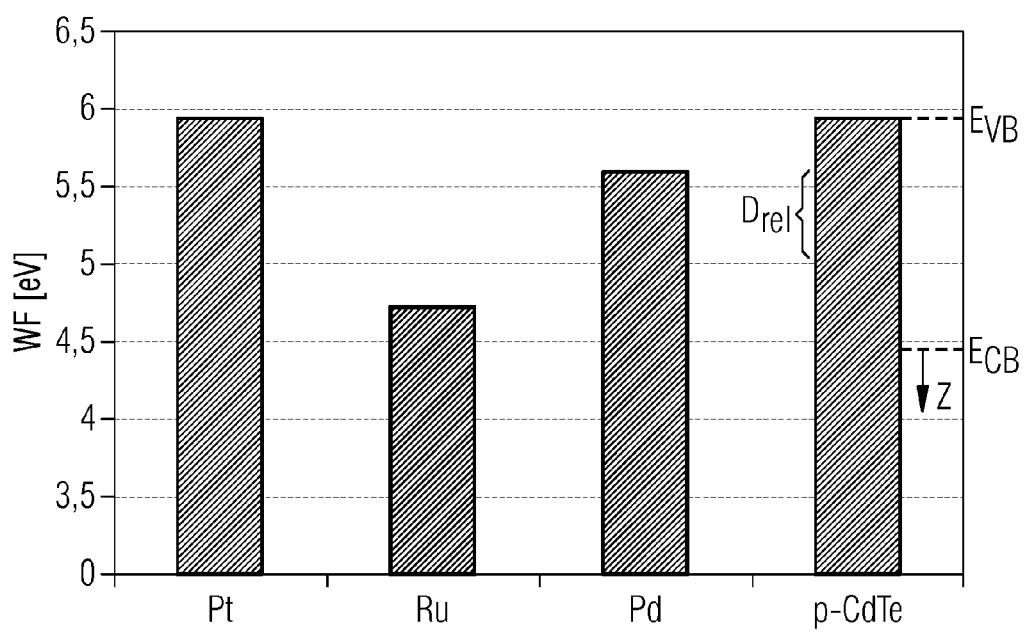

FIG. 7 is a schematic representation of the work functions (WF) of various precious metals compared to the electrical ratios in a CdTe semiconductor of semiconductor type p. All values are measured according to Michaelson (at room temperature). The valence band energy (EVB) and the conduction band energy (ECB) are displayed to the right of the bar for the CdTe semiconductor. The arrow to the conduction band (ECB) displays the lowering direction (Z), in which the energy level of the conduction band lowers with the increasing proportion of foreign atoms (e.g. Zn in CdZnTe semiconductor systems), while the band gap widens. The relevant range (Drel.) for radiation detectors of the Fermi level is displayed to the left of this bar and lies in the range of approximately 5.0 eV to approximately 5.6 eV. The work functions of both Pd and Pt are higher than this range, so that no ideal ohmic contact could be obtained from the pure precious metal contacts. With metal contacts according to the invention with corresponding ruthenium additives, the work function of the contact layer can, however, be adjusted, if desired, in the relevant ranges, i.e. to the adjusted built-in voltage by means of the intermediate layer on the semiconductor (corresponding to the electronic ratios from FIG. 5).

Figure 8:
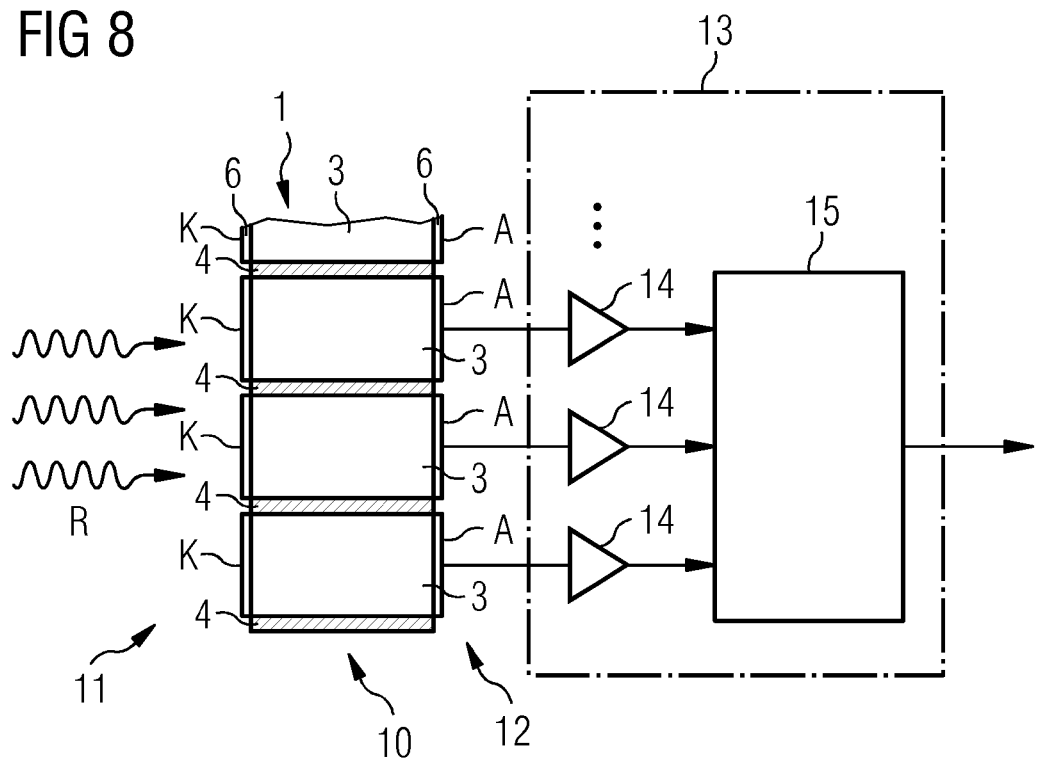

FIG. 8 depicts an example embodiment for a radiation detector (10) according to the invention, featuring an evaluation unit (13). For the formation of the detector, inventively semi-conductive converter elements (3) are arranged as a matrix alongside each other with a metal contact made from a ruthenium-containing contact layer (6) both on the anode (A) and the cathode (K) side (only one section of a series of this detector is represented in FIG. 6); they are split by septa (4). The radiation detector (10) comprises a cathode assembly (11) and an anode assembly (12), so that each converter element (3) is provided on a cathode side with a cathode (K) and on an anode site with an anode (A). The ionizing radiation which is to be detected, e.g. X-radiation (R), gathers on the cathode side of the radiation detector (10). A radiation detector according to an embodiment of the present invention can, however, be constructed in such a way that the radiation to be detected (R) drops from a different direction of incidence onto the radiation detector, e.g. the radiation detector is equipped in such a way that the cathode side and the anode side are parallel to the radiation's direction of incidence.

The radiation detector (10) is here equipped with an evaluation unit (13) that comprises a pre-amplifier (14) for each converter element (3) for the initial pre-amplification of the signal occurring in this converter element (3). The coupling of the pre-amplifier (14) to the anode (A) is depicted in the diagram in a very simplified form. The person skilled in the art will be familiar with the fundamental methods, such as how signals can be read out and processed by a radiation detector. The pre-amplifiers (14) are linked to a signal processing device (15), in which the signals are processed and then, for example, transferred to an evaluating processor unit (not depicted here).

Figure 9:
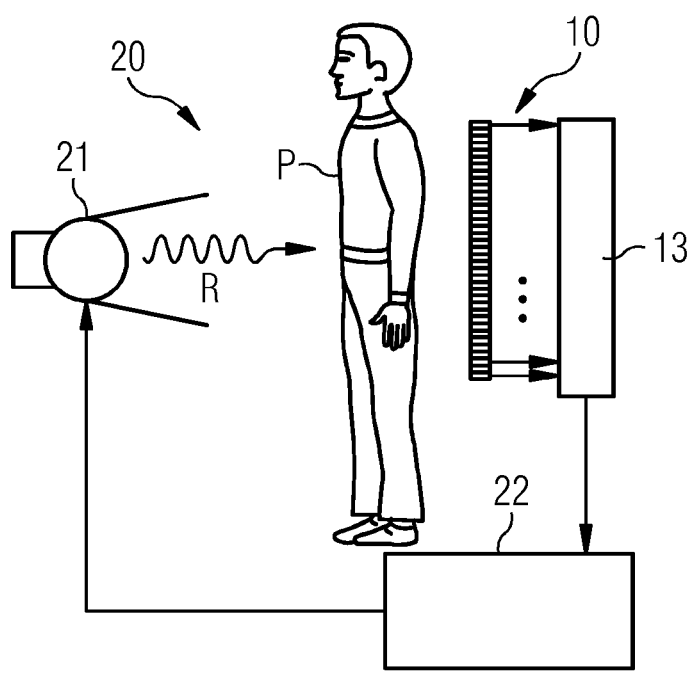

FIG. 9 depicts a very simple example embodiment for a medical device (20), in this case an X-ray system (20). This comprises an X-ray machine (21), a radiation detector (10) according to an embodiment of the invention with an evaluation unit (13) and a system controller (22). The X-ray machine (21) and the radiation detector (10) are arranged operationally opposite each other in such a way that the radiation direction of the X-ray machine (21) is pointing towards the radiation detector (10). An object of investigation (P), for example a patient and/or the patient's body part, is then positioned accordingly between the X-ray machine (21) and the radiation detector (10), in order to record the X-radiation (R) emitted from the X-ray machine (21) and weakened by the object of investigation (P), for the recording of an X-ray image by the radiation detector (10). The X-ray machine's (21) input signal is carried out here by way of a very simplified system controller (22), which also transfers the processed detector signals from the evaluation unit for further processing, in order, for example, to reconstruct an image from the detector signal and to display it to a user, or to save it in the memory.

It is recalled that the above-described detector elements, radiation detectors, medical devices and methods for the production of detector elements are concerned solely with the example embodiments, which can be modified in various ways by the person skilled in the art without departing from the scope of the invention, as long as it is permitted in the claims. In particular, the same or at least similar effects can be obtained when a ruthenium-containing metal contact is applied solely to the one side, either to the anode or the cathode side of such a detector element. Moreover, the overall concept according to the present invention and in particular the advantages of energy band distortion and the sinking of the built-in voltage are also applied to palladium contacts without ruthenium. In the interests of completeness, it is also recalled that the use of the indefinite article "a" does not exclude the fact that the effected characteristics can also exist as a plurality. Similarly, the term "element" as a component does not exclude the fact that it consists of several components that can be distributed spatially, if necessary.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Still further, any one of the above-described and other example features of the present invention may be embodied in the form of an apparatus, method, system, computer program, tangible computer readable medium and tangible computer program product. For example, of the aforementioned methods may be embodied in the form of a system or device, including, but not limited to, any of the structure for performing the methodology illustrated in the drawings.

Even further, any of the aforementioned methods may be embodied in the form of a program. The program may be stored on a tangible computer readable medium and is adapted to perform any one of the aforementioned methods when run on a computer device (a device including a processor). Thus, the tangible storage medium or tangible computer readable medium, is adapted to store information and is adapted to interact with a data processing facility or computer device to execute the program of any of the above mentioned embodiments and/or to perform the method of any of the above mentioned embodiments.

The tangible computer readable medium or tangible storage medium may be a built-in medium installed inside a computer device main body or a removable tangible medium arranged so that it can be separated from the computer device main body. Examples of the built-in tangible medium include, but are not limited to, rewriteable non-volatile memories, such as ROMs and flash memories, and hard disks. Examples of the removable tangible medium include, but are not limited to, optical storage media such as CD-ROMs and DVDs; magnetooptical storage media, such as MOs; magnetism storage media, including but not limited to floppy disks (trademark), cassette tapes, and removable hard disks; media with a built-in rewriteable non-volatile memory, including but not limited to memory cards; and media with a built-in ROM, including but not limited to ROM cassettes; etc. Furthermore, various information regarding stored images, for example, property information, may be stored in any other form, or it may be provided in other ways.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A detector element comprising:
a semi-conductive converter element; and
metal contacts arranged on the semi-conductive converter element for at least one anode and at least one cathode, wherein at least one of the metal contacts comprises a contact layer made from a contact material including a metal and ruthenium, wherein the contact layer comprises two or more layers, and wherein at least one layer, of the two or more layers, that comes into contact with the semi-conductive converter element, comprises ruthenium.

2. The detector element of claim 1, wherein the semi-conductive converter element comprises a radiation detection material that is made from at least one compound selected from the group consisting of:

$Cd_xZn_{1-x}Te_ySe_{1-y}$ (with $0 \leq x \leq 1$; $0 \leq y \leq 1$), $Cd_xMn_{1-x}Te_ySe_{1-y}$ (with $0 \leq x \leq 1$; $0 \leq y \leq 1$), $Ga_xIn_{1-x}As_ySb_{1-y}$ (with $0 \leq x \leq 1$; $0 \leq y \leq 1$), $Al_xIn_{1-x}As_ySb_{1-y}$ (with $0 \leq x \leq 1$; $0 \leq y \leq 1$), $Ga_xIn_{1-x}P_ySb_{1-y}$ (with $0 \leq x \leq 1$; $0 \leq y \leq 1$), $Al_xIn_{1-x}P_ySb_{1-y}$ (with $0 \leq x \leq 1$; $0 \leq y \leq 1$), $Ga_xIn_{1-x}Sb_yN_{1-y}$ (with $0 \leq x \leq 1$; $0 \leq y \leq 1$), and $Ga_xIn_{1-x}N_yP_{1-y}$ (with $0 \leq x \leq 1$; $0 \leq y \leq 1$).

3. The detector element as claimed in claim 2, wherein the radiation detection material comprises a number of defects in a region of the converter element adjacent to the contact layer which reduce the contact resistance between the metal and the semiconductor, compared to a direct contact between both of the metal and the semiconductor.

4. The detector element of claim 1, wherein the radiation detection material comprises a number of defects in a region of the converter element adjacent to the contact layer which reduce the contact resistance between the metal and the semiconductor, compared to a direct contact between both of the metal and the semiconductor.

5. The detector element of claim 1, wherein the radiation detection material comprises a number of halogen-, oxygen- or metal-based defects in a region of the converter element adjacent to the contact layer.

6. The detector element of claim 1, wherein the contact material comprises a metal alloy.

7. The detector element of claim 1, wherein the contact material comprises palladium, platinum or a mixture of palladium and platinum.

8. A radiation detector comprising:
a plurality of detector elements of claim 1.

9. A medical device comprising the radiation detector of claim 8.

10. The radiation detector of claim 8, further comprising:
an evaluation unit to read out a detector signal.

11. A medical device comprising the radiation detector of claim 10.

12. The detector element as claimed in claim 1, wherein the at least one of the metal contacts includes at least one of a metal compound of a metal salt of a metal, and a ruthenium compound of a ruthenium salt.

13. A radiation detector comprising:
a plurality of detector elements of claim 12.

14. A medical device comprising the radiation detector of claim 13.

15. A method for the production of a detector element including a semi-conductive converter element and metal contacts arranged thereon for at least one anode and at least one cathode, comprising:
applying, on the converter element, at least one of the metal contacts including a contact material; comprising a metal base and ruthenium, wherein the applying includes first depositing a metal with a relatively highest electrochemical potential, and next depositing a metal with a next relatively highest electrochemical potential.

16. The method of claim 15, wherein solutions of at least one of the metal and ruthenium comprise at least one of water and organic solvent.

17. The method of claim 15, wherein the metal with the relatively highest electrochemical potential is ruthenium.

18. A method for the production of a detector element including a semi-conductive converter element and metal contacts arranged thereon for at least one anode and at least one cathode, comprising:
applying, on the converter element, at least one of the metal contacts including a contact material comprising a metal base and ruthenium, wherein the at least one of the metal contacts includes at least one of a metal compounds of a metal salts of metals and a ruthenium compounds of a ruthenium salts.

19. The method of claim 18, wherein the applying includes first depositing a metal with the relatively highest electrochemical potential and next depositing a metal with the next relatively highest electrochemical potential.

20. The method of claim 18, wherein at least one of the metal salts are halides and the ruthenium salts are halides.

* * * * *